US012411618B2

(12) United States Patent
Cresci et al.

(10) Patent No.: US 12,411,618 B2
(45) Date of Patent: *Sep. 9, 2025

(54) ADAPTIVE TEMPERATURE PROTECTION FOR A MEMORY CONTROLLER

(71) Applicant: Micron Technology, Inc., Boise, ID (US)

(72) Inventors: Federica Cresci, Milan (IT); Massimiliano Patriarca, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/768,928

(22) Filed: Jul. 10, 2024

(65) Prior Publication Data
US 2025/0013369 A1 Jan. 9, 2025

Related U.S. Application Data

(63) Continuation of application No. 17/929,963, filed on Sep. 6, 2022, now Pat. No. 12,050,780.

(51) Int. Cl.
*G06F 3/06* (2006.01)
(52) U.S. Cl.
CPC .......... *G06F 3/0619* (2013.01); *G06F 3/0653* (2013.01); *G06F 3/0679* (2013.01)
(58) Field of Classification Search
CPC .... G06F 3/0619; G06F 3/0616; G06F 3/0653; G06F 3/0679; G06F 3/0673;
(Continued)

(56) References Cited

U.S. PATENT DOCUMENTS 9,811,267 B1 * 11/2017 Yang .............. G11C 16/26
2014/0281311 A1 * 9/2014 Walker .............. G06F 3/0631
711/170

(Continued)

FOREIGN PATENT DOCUMENTS

| CN | 107958677 A | 4/2018 |
| CN | 114816899 A | 7/2022 |
| JP | 09-101901 A | 4/1997 |

OTHER PUBLICATIONS

JPHOSTO19014 "System and Method for Message Communication Between Processes Performer on Personal Computer Operated By Multiprocess", Applicants: NTT Data Tsushin KK Inventors: Kobayashi Mayumi, Adachi Sadamasa, Asanuma Kazuhiko (provided in IDS filed Sep. 1, 2022 ) (Year: 1997).

(Continued)

*Primary Examiner* — Tracy C Chan
(74) *Attorney, Agent, or Firm* — Holland & Hart LLP

(57) ABSTRACT

Methods, systems, and devices for adaptive temperature protection for a memory controller are described. In some cases, a memory system may include a set of temperature sensors distributed across the memory system. The set of temperature sensors may be used to monitor or model the temperature of one or more sections of the memory system. Upon determining that the temperature of a section exceeds a threshold, the memory system may employ one or more mitigation techniques to reduce the temperature or the rate of change of the temperature of the section. For example, the memory system may reduce a clock frequency corresponding to the section, while maintaining separate clock frequencies for other sections of the memory system. Additionally or alternatively, the memory system may transfer data or other information from the section to a separate section.

20 Claims, 6 Drawing Sheets

(58) Field of Classification Search
CPC ...... G06F 3/0608; G06F 3/068; G06F 3/0604; G06F 3/0631; G06F 3/0634; G06F 3/0688; G06F 3/0614; G06F 13/1689; G06F 1/206; G06F 1/3296; G06F 1/3225; G06F 1/3275; G06F 11/3058; G06F 11/3034
See application file for complete search history.

(56) References Cited

U.S. PATENT DOCUMENTS

| | | | |
|---|---|---|---|
| 2014/0359242 A1* | 12/2014 | Son | G06F 13/1689 711/167 |
| 2016/0062421 A1* | 3/2016 | Sugawara | G06F 1/3268 700/299 |
| 2016/0117105 A1* | 4/2016 | Thangaraj | G06F 3/0604 711/103 |
| 2019/0138224 A1* | 5/2019 | Yang | G06F 3/0614 |
| 2019/0339755 A1* | 11/2019 | Chai | G06F 1/305 |
| 2020/0257604 A1* | 8/2020 | Roh | G06F 11/3058 |
| 2022/0122215 A1* | 4/2022 | Ray | G06T 1/60 |
| 2022/0228925 A1 | 7/2022 | Palmer | |
| 2022/0229580 A1 | 7/2022 | Palmer | |

OTHER PUBLICATIONS

Chinese patent office, "China Office Action," issued in connection with China Patent Application No. 202311133867.X dated Feb. 28, 2025 (9 pages) (4 pages of English Translation and 5 pages of Original Document).

\* cited by examiner

ADAPTIVE TEMPERATURE PROTECTION FOR A MEMORY CONTROLLER

CROSS REFERENCE

The present Application for Patent is a continuation of U.S. patent application Ser. No. 17/929,963 by Cresci et al., entitled "ADAPTIVE TEMPERATURE PROTECTION FOR A MEMORY CONTROLLER," filed Sep. 6, 2022, which is assigned to the assignee hereof, and is expressly incorporated by reference herein.

FIELD OF TECHNOLOGY

The following relates to one or more systems for memory, including adaptive temperature protection for a memory controller.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Some memory systems may include interfaces (e.g., the Compute Express Link (CXL) interface) designed to be used between a host system and multiple memory devices of the memory system (e.g., multiple memory dies). For example, the host system may store and access a large amount data across the multiple memory devices with a high rate of data transfer through the interface. Accordingly, the temperature of a component of the interface associated with a first memory device, such as a first cache or a memory controller for the first memory device, receiving a relatively high quantity of access operations may increase more quickly relative to a component of the interface associated with a second memory device, such as a second cache or a memory controller for the second device, receiving a relatively low quantity of access operations. In some cases, if a memory system detects a high temperature of a component of the interface, the memory system may perform one or more mitigation techniques to reduce or mitigate the temperature across the entire interface, such as throttling a clock frequency or clock speed of the memory system. However, such a mitigation technique may reduce processing speed of other memory devices or components of the system, which may not experience a high temperature (e.g., due to the uneven distribution of access operations). Accordingly, methods to improve efficiency of mitigation techniques are desired.

As described herein, a memory system, such as a CXL memory system, may include a set of temperature sensors distributed across a substrate of the memory system. The set of temperature sensors may be used to monitor or model the temperature of one or more sections of the interface. Upon determining that the temperature of a section exceeds a threshold, the memory system may employ one or more mitigation techniques to reduce the temperature or the rate of change of the temperature of the section. For example, the memory system may reduce a clock frequency corresponding to the section, while maintaining separate clock frequencies for other sections of the memory system. Additionally or alternatively, the memory system may transfer data or other information (e.g., control information such as indications of physical addresses of data) from the section to a separate section. Accordingly, the memory system may efficiently manage high temperature sections without adversely impacting other sections.

Features of the disclosure are initially described in the context of systems and dies as described with reference to FIG. 1. Features of the disclosure are described in the context of a system and a timing diagram as described with reference to FIGS. 2 through 3. These and other features of the disclosure are further illustrated by and described with reference to an apparatus diagram and flowcharts that relate to adaptive temperature protection for a memory controller as described with reference to FIGS. 4 through 6.

Figure 1:
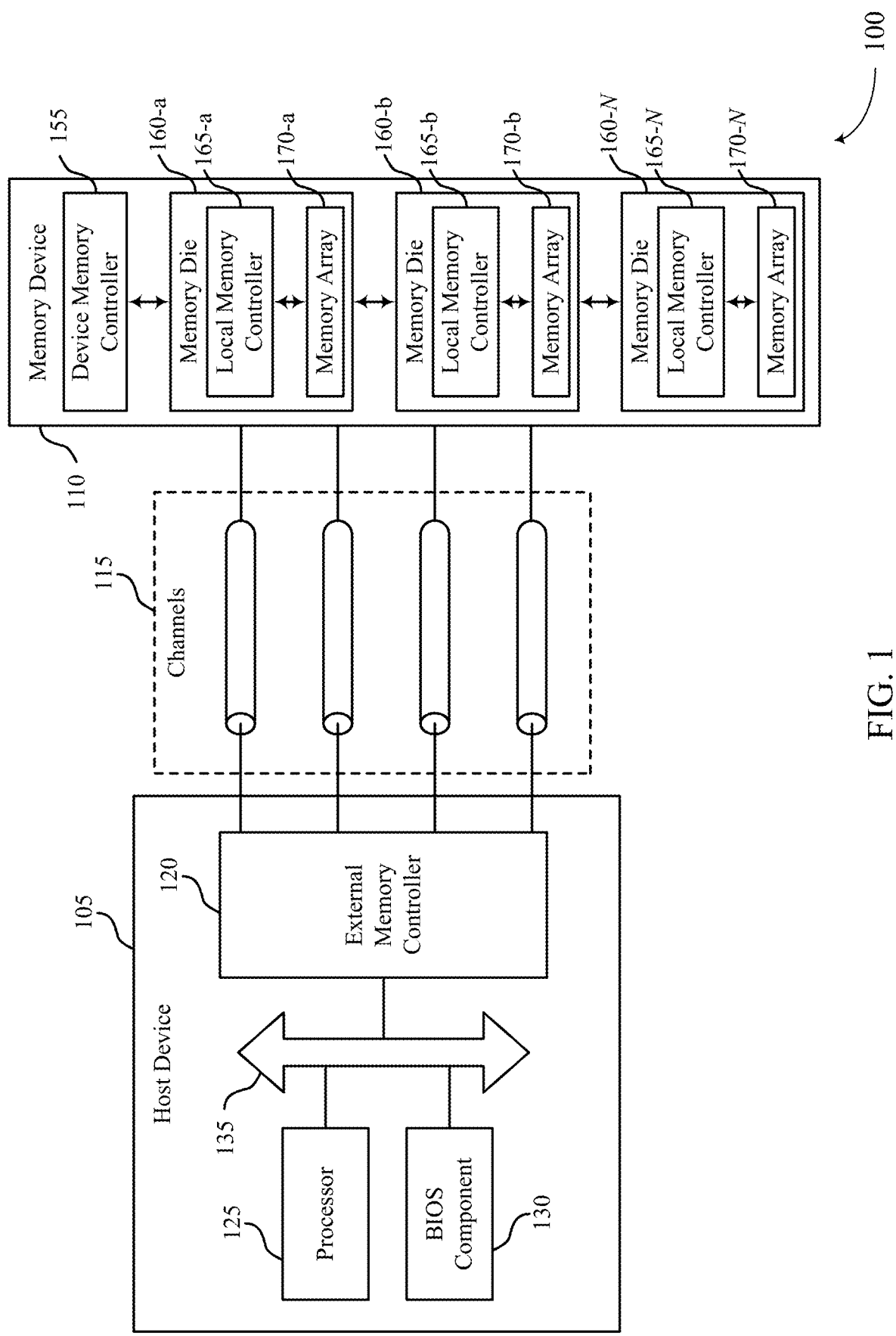
FIG. 1 illustrates an example of a system that supports adaptive temperature protection for a memory controller in accordance with examples as disclosed herein.

FIG. 1 illustrates an example of a system 100 that supports adaptive temperature protection for a memory controller in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be used to communicate information using one or more interfaces. For example, the channels 115 may include channel links, such as CXL links, peripheral component interconnect express (PCIe) links, or other PCIe based interface links. In some cases, the channels 115 may include one or more serial data lanes (e.g., differential signaling pairs).

In some cases, a memory system 110 may include a set of temperature sensors distributed across the memory system 110. The set of temperature sensors may be used to monitor or model the temperature of one or more sections of the memory system 110, such as the one or more memory dies 160, or interfaces of the memory system 110 for communication with the one or more memory dies 160. Upon determining that the temperature of a section exceeds a threshold, the memory system 110 may employ one or more mitigation techniques to reduce the temperature or the rate of change of the temperature of the section. For example, the memory system 110 may reduce a clock frequency corresponding to the section, while maintaining separate clock frequencies for other sections of the memory system 110. Additionally or alternatively, the memory system 110 may transfer data or other information (e.g., control information such as indications of physical addresses of data) from the section to a separate section. Accordingly, the memory system 110 may efficiently manage high temperature sections without adversely impacting other sections. Although FIG. 1 may depict a memory device having a DRAM architecture, the techniques described herein may be applied to other memory systems, such as memory systems using other types of volatile or non-volatile memory cells.

Figure 2:
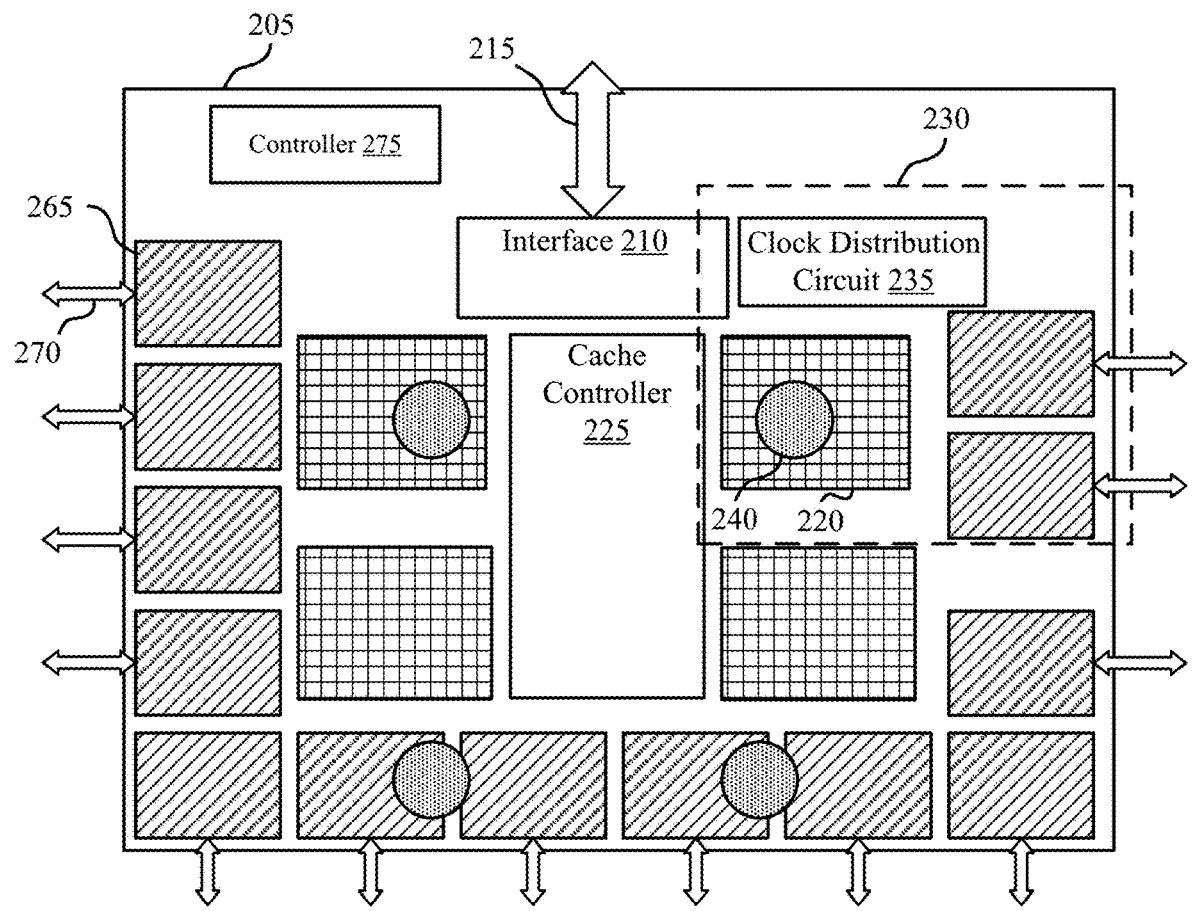
FIG. 2 illustrates an example of a system that supports adaptive temperature protection for a memory controller in accordance with examples as disclosed herein.

FIG. 2 illustrates an example of a system 200 that supports adaptive temperature protection for a memory controller in accordance with examples as disclosed herein. The system 200 may be an example of a CXL memory device, which may communicate commands and data to a host system (e.g., a host system 105 as described with reference to FIG. 1) using an interface 210. Interface 210 may transfer data with a host device over an interface 215 according to a protocol (e.g., CXL protocol). The system 200 may be arranged on a substrate 205 and may include a set of caches 220, each cache 220 coupled with a cache controller 225. The system may further include a set of memory controllers 265, each memory controller 265 coupled with a respective memory device (not shown) via a respective memory interface 270. In some examples, the interface 210 may be configured to process commands, data, or both using the cache controller 225, the set of memory controllers 265, or both to store data in the caches 220, the memory devices, or any combination thereof. For example, the interface 210 may receive a command to retrieve data associated with a logical address of a logical address space. In some cases, the system 200 may store the data at a physical address (e.g., device physical address (DPA)) of a memory device corresponding to the logical address. The interface 210 may determine the DPA for the data associated with the logical address to perform the command. The interface 210 may communicate with a memory controller 265 coupled with the memory device associated with the DPA. The memory controller 265 may retrieve the data and send the data to the interface 210 (e.g., via the cache 220). Additionally or alternatively, the data may be stored at a cache 220 (e.g., the system 200 may have previously cached the data). Accordingly, the cache controller 225 may retrieve the data from the cache 220 and transmit the data to the interface 210.

The system 200 may include a set of sections 230 distributed across the substrate 205. A section 230 may correspond to a region of the substrate 205, as depicted in FIG. 2, and may include one or more components of the system 200. For example, the section 205 may include one or more caches 220, one or more memory controllers 265, or any combination thereof. Although FIG. 2 depicts an example in which the section 230 includes both a cache 220 and a set of memory controllers 265, such an arrangement may be exemplary, as other arrangements (e.g., a section 230 which does not include a cache 220 or a section 230 which does not include a memory controller 265) may be possible.

A section 230 or a portion of a section 230 may operate according to a respective clock of a plurality of clocks of the system 200. For example, operations performed by a component of a section 230 may be synchronized with or controlled by a clock frequency (e.g., a speed) of a clock corresponding to the section 230. In some cases, a first clock corresponding to a first section 230 may operate according to a different frequency than a second clock of a second section 230. For example, the frequency of the second clock may be less than the frequency of the first clock. Accordingly, operations of the components of the second section 230 may be slower relative to operations of components of the first section 230.

In some cases, the system 200 may include a clock distribution circuit 235 configured to control and distribute the set of clocks of the system 200. For example, the clock distribution circuit 235 may manage the frequency or other timing aspects for each clock of the set of clocks, and may supply a respective clock signal to each section 230, (e.g., to each component of each section 230). In some examples, the clock distribution circuit may be configured to modify a clock of the set of clocks, such as by reducing or increasing the frequency (e.g., speed) of the cock. In such instances, the clock distribution may supply a modified clock signal to a section 230 corresponding to the modified clock.

The system 200 may include a set of temperature sensors 240 distributed across the substrate 205. Each temperature sensor 240 may be configured to determine (e.g., measure) a temperature corresponding to an area of the substrate 205 surrounding the temperature sensor 240. In some cases, a temperature sensor 240 may be associated with a section 230, such that a temperature sensed by the temperature sensor may provide an indication of the temperature of the associated section 230.

A section 230 may include multiple temperature sensors 240, and a temperature for the section 230 may be determined using the multiple temperature sensors. Additionally or alternatively, a section 230 may not include a temperature sensor. In such cases, the system 200 may determine a temperature for the section 230 using a temperature of nearby sections 230 or nearby temperature sensors 240 (e.g., temperature sensors corresponding to different sections 230). For example, the system 200 may generate a heat map indicating a temperature for each section. In some examples, the temperature sensors 240 may report the respective measured temperatures to a component of the system 200, such as firmware stored in a controller 275.

In some cases, the system may monitor the temperatures of the sections 230 and may determine whether a temperature for a section 230 exceeds a threshold (e.g., whether a section 230 may be overheating). If the system 200 determines that a temperature of a section exceeds the threshold, the system 200 may perform one or more operations to reduce the temperature of the section or mitigate potential damage or corruption of stored data. For example, the system 200 may modify a clock frequency of the section 230, modify a set of operational parameters for components of the section 230, transfer data or other information from the section 230, or any combination thereof.

To modify the clock frequency of the section 230, the clock distribution circuit 235 may reduce (e.g., throttle) the clock frequency (e.g., a first clock frequency) for a first clock associated with the section 230 (e.g., a clock associated with a cache 220 of the section 230, a clock associated with a memory controller 265 of the section 230, or both) relative to a second clock frequency of a second clock associated with a second section 230 (e.g., a section 230 with a corresponding temperature beneath the threshold). Accordingly, the system 230 may operate the section 230 according to the first clock frequency and may operate the second section 230 according to the second clock frequency. In some cases, throttling the frequency of a clock for a section 230 may reduce the temperature of the section 230.

Additionally or alternatively, the system 200 may modify one or more parameters corresponding to a section 230 having a temperature above the threshold. For example, a cache 220 of the section 230 may store data associated with a set of DPAs corresponding to physical addresses of a memory device coupled with a memory controller 265 associated with the cache 220. In some cases, the cache 220 may additionally store a set of parameters associated with each DPA, such as a retain bit, a flush bit, a bypass bit, or any combination thereof. To modify a parameter of the section 230, the system 200 may set (e.g., assert) one or more of the retain bits, flush bits, or bypass bits for each DPA of the cache 220.

In some cases, setting the flush bit for a DPA may indicate that data associated with the DPA may be transferred (e.g., flushed) from the cache 220 to the memory device associated with the DPA. Accordingly, upon setting the flush bit for the DPA, the system 200 may transfer the data associated with the DPA to the corresponding physical address of the memory device.

In some cases, setting the retain bit for a DPA may indicate that data associated with the DPA may be retained in the cache 220 (e.g., the data may be excluded from being evicted from the cache 220). Thus, upon setting the retain bit for the DPA, the system 200 may refrain from (e.g., suppress) transferring the data associated with the DPA to the corresponding physical address of the memory device. Accordingly, if the system 200 receives a command to access the data associated with the DPA (e.g., via the interface 210), the system 200 may retrieve the data from the cache 220, rather than from the physical address of the memory device.

In some cases, setting the bypass bit for a DPA may indicate to bypass the cache 220 and retrieve data associated with the DPA directly from the corresponding physical address of a memory device coupled with a memory controller 265. For example, upon receiving a command for the data associated with the DPA (e.g., via the interface 210), the system 200 may retrieve the data from the memory device and subsequently transmit the data.

In some examples, upon determining that the temperature of a first section 230 exceeds the threshold, the system 200 may transfer data or DPAs associated with the first section 230 to a second section 230 (e.g., a section 230 having a temperature below the threshold). For example, the system 200 may reassign DPAs from one or more caches 220 of the first section 230 to one or more caches 220 of the second section 230. In such instances, the system 200 (e.g., via the cache controller 225) may retrieve DPAs from the one or more caches 220 of the first section 230 and write the DPAs to the one or more caches 220 of the second section. In some cases, the system 200 may additionally transfer data associated with the DPAs from memory devices coupled with memory controllers 265 of the first section 230 to memory devices coupled with memory controllers 265 of the second section. Additionally or alternatively, upon determining that the temperature of a first section 230 exceeds the threshold, the system 200 may bypass the cache for the one or more caches 220 for the first section 230.

Figure 3:
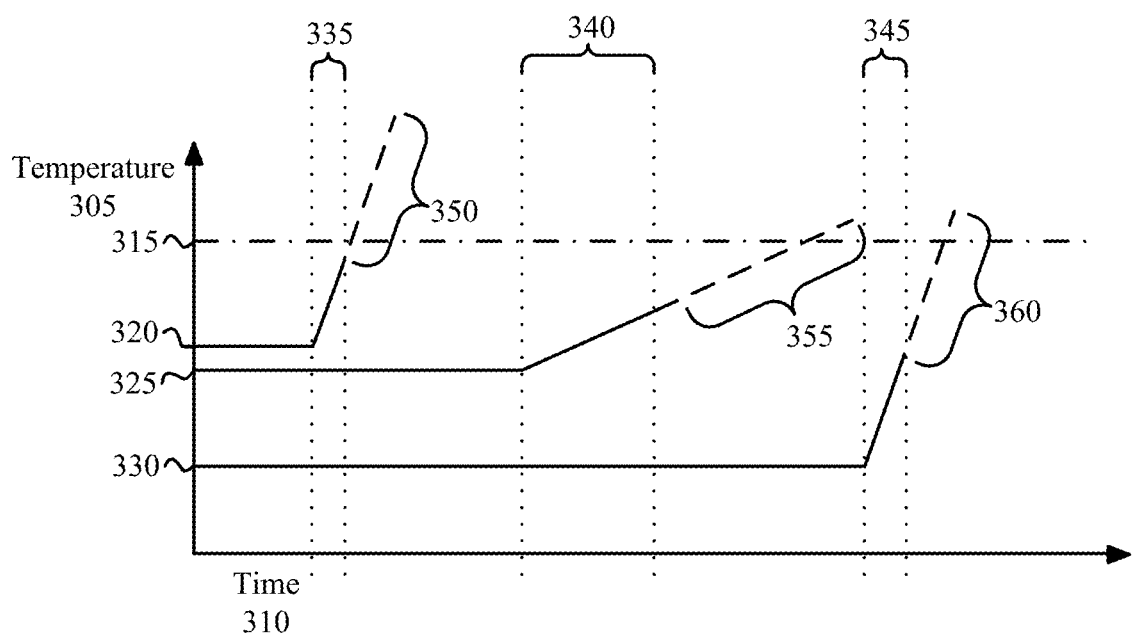
FIG. 3 illustrates an example of a timing diagram that supports adaptive temperature protection for a memory controller in accordance with examples as disclosed herein.

FIG. 3 illustrates an example of a timing diagram 300 that supports adaptive temperature protection for a memory controller in accordance with examples as disclosed herein. The timing diagram 300 may illustrate a temperature 305 of various sections of a memory system (e.g., sections 230 of the system 200, as described with reference to FIG. 2) over time 310 during operation of the memory system. For example, the timing diagram 300 may illustrate a temperature of a first section 320, a temperature of a second section 325, and a temperature of a third section 330.

With reference to the temperature of the first section 320, the memory system may measure or determine (e.g., using the set of temperature sensors 240 or a generated heatmap as described with reference to FIG. 2) the temperature of the first section 320 during a first interval 335. In some cases, the memory system may determine that the temperature of the first section 320 does not exceed a temperature threshold 315 during the first interval 335.

However, based on the rate of change of the temperature of the first section 320 during the first interval 335, the memory system may determine or calculate a prediction or estimation of the temperature of the first section 320 following the first interval 335. For example, the memory system may calculate a predicted temperature trend 350 using a same or similar rate of change of the temperature of the first section 320 during the first interval 335. In some cases, the calculated temperature trend 350 may exceed the temperature threshold 315. Thus, to prevent or mitigate damage to the memory system associated with the temperature of the first section 320 exceeding the temperature threshold 315, the memory system may perform one or more mitigation techniques to mitigate the temperature of the first section 320 prior to the temperature of the first section 320 exceeding the threshold 315. In some cases, the degree of the mitigation technique may be commensurate with the calculated temperature trend 350. That is, the memory system may combine mitigation techniques as described with reference to FIG. 2. For example, if the calculated temperature trend 350 greatly exceeds the temperature threshold 315, or the calculated temperature trend 350 is predicted to exceed the temperature threshold in a relatively short amount of time, the memory system may bypass the first section (e.g., using the retain bits, the bypass bits, or both), or may transfer data, DPA's, or both to a section having a lower temperature.

Additionally or alternatively, if a calculated temperature trend of a section is predicted to exceed the threshold 350 in a relatively longer amount of time (e.g., compared with the calculated temperature trend 350), the memory system may perform relatively less severe mitigation techniques. For example, with reference to the temperature of the second section 325, the memory system may measure or determine (e.g., using the set of temperature sensors 240 or a generated heatmap as described with reference to FIG. 2) the temperature of the second section 325 during a second interval 340.

In some cases, the memory system may determine that the temperature of the second section 325 does not exceed the temperature threshold 315 during the second interval 340. However, the memory system may calculate a predicted temperature trend 355 using a same or similar rate of change of the temperature of the second section 325 during the second interval 340. Based on the temperature trend 355 the memory system may throttle the clock frequency (e.g., to a second clock frequency) of the second section. For example, the memory system may operate the second section according to the second clock frequency, which may mitigate the temperature of the second section 325 or the rate of change of the temperature of the second section 325.

In some examples, both the temperature of a section and the rate of change of the temperature of the section may determine the mitigation techniques performed by the memory system. For example, the temperature of the third section 330 may be lower than the temperature of the first section 320 and the temperature of the second section 325, and may have a higher rate of change during a third interval 345. Accordingly, a calculated temperature trend 360 may be predicted to exceed the threshold 350 in a relatively shorter amount of time compared with the temperature trend 355, and a relatively longer amount of time compared with the temperature trend 350. Thus, the memory system may throttle the clock frequency of the third section to a lower frequency compared with the second section (e.g., to a third clock frequency lower than the second clock frequency). For example, the memory system may operate the third section according to the third clock frequency, which may mitigate the temperature of the third section 330 or the rate of change of the temperature of the third section 330. Additionally or alternatively, the memory system may combine mitigation techniques based on the temperature trend 360. For example, after throttling the clock frequency of the third section, the memory system may measure the temperature of the third section 330 and calculate a second predicted temperature trend to determine whether throttling the clock frequency mitigated the temperature of the third section 330. If the second predicted temperature trend still exceeds the threshold 315, the memory system may apply additional mitigation techniques, such as setting the bypass or retain bits of the third section.

Figure 4:
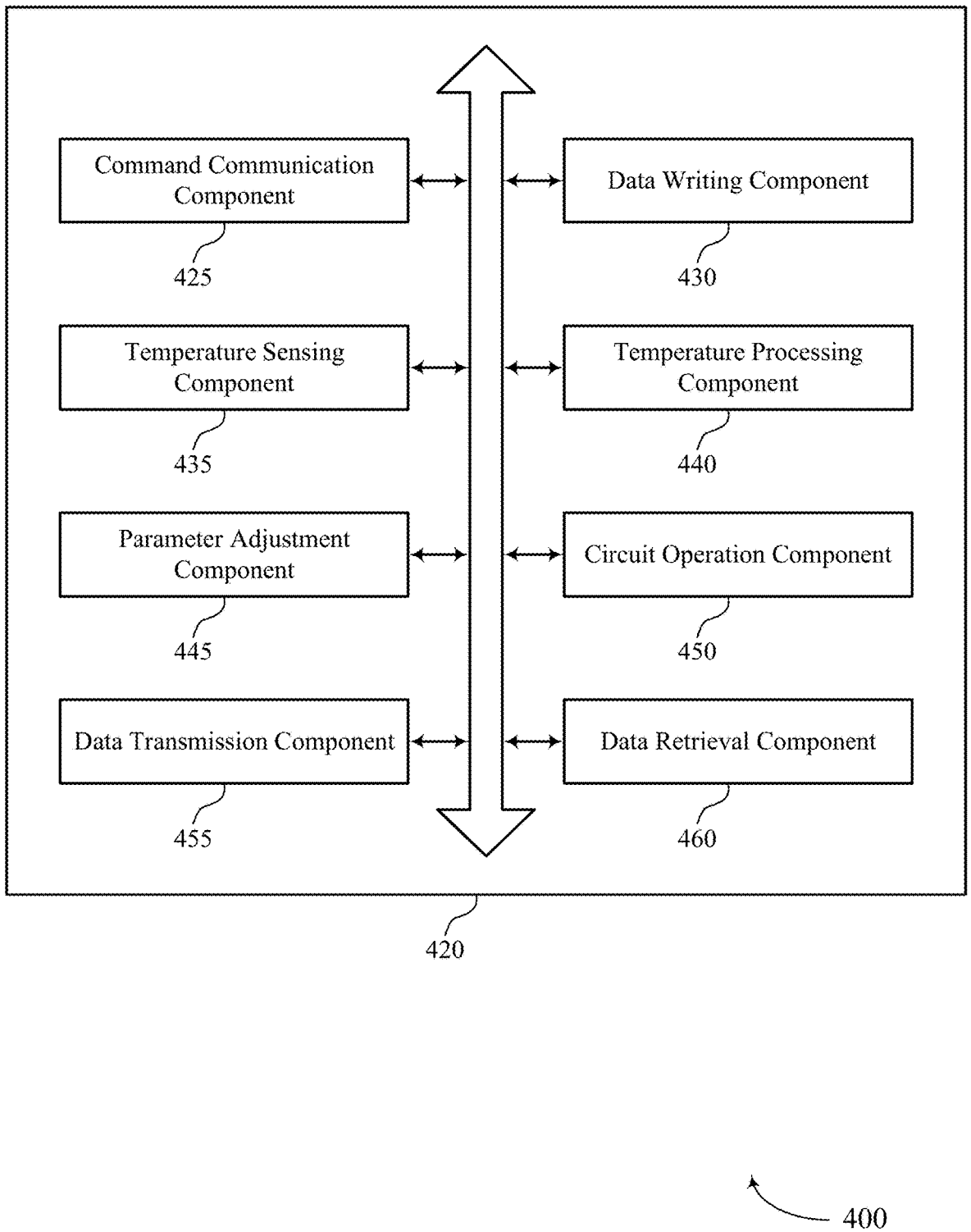
FIG. 4 shows a block diagram of a memory expander that supports adaptive temperature protection for a memory controller in accordance with examples as disclosed herein.

FIG. 4 shows a block diagram 400 of a memory expander 420 that supports adaptive temperature protection for a memory controller in accordance with examples as disclosed herein. The memory expander 420 may be an example of aspects of a memory expander as described with reference to FIGS. 1 through 3. The memory expander 420, or various components thereof, may be an example of means for performing various aspects of adaptive temperature protection for a memory controller as described herein. For example, the memory expander 420 may include a command communication component 425, a data writing component 430, a temperature sensing component 435, a temperature processing component 440, a parameter adjustment component 445, a circuit operation component 450, a data transmission component 455, a data retrieval component 460, or any combination thereof. Each of these components may communicate, directly or indirectly, with one another (e.g., via one or more buses).

The command communication component 425 may be configured as or otherwise support a means for communicating, using a first circuit on a substrate, first signaling indicative of first commands and first data according to a first protocol. The data writing component 430 may be configured as or otherwise support a means for writing, using a plurality of caches, at least a subset of the first data according to physical addresses associated with respective commands of the first commands. In some examples, the command communication component 425 may be configured as or otherwise support a means for communicating, using a plurality of second circuits on the substrate and with a plurality of memory devices, second signaling indicative of second commands and second data according to a second protocol, where communicating the second signaling includes reading at least a portion of the subset of the first data to obtain the second data and writing the second data to one or more of the plurality of memory devices, and where each of a plurality of sections of the substrate includes at least one of the plurality of second circuits. The temperature sensing component 435 may be configured as or otherwise support a means for sensing respective temperatures at respective locations of the substrate using a plurality of sensors located at the respective locations of the substrate. The temperature processing component 440 may be configured as or otherwise support a means for determining, at a logic on the substrate, whether a temperature of a first section of the plurality of sections of the substrate satisfies a threshold based at least in part on the respective temperatures sensed at the respective locations. The parameter adjustment component 445 may be configured as or otherwise support a means for modifying a respective parameter of a plurality of parameters associated with an indication of one or more of the physical addresses written to a cache of the plurality of caches based at least in part on determining that the temperature of the first section satisfies the threshold.

In some examples, the parameter adjustment component 445 may be configured as or otherwise support a means for modifying the respective parameter associated with a first subset of the one or more physical addresses to indicate to transfer respective data associated with each physical address of the first subset. In some examples, the data writing component 430 may be configured as or otherwise support a means for transferring the data associated with each physical address of the first subset from the cache of the first section to the respective physical address of a respective memory device of the plurality of memory devices.

In some examples, the parameter adjustment component 445 may be configured as or otherwise support a means for modifying a second parameter associated with a second subset of the one or more physical addresses to indicate that data associated with the physical address is written to the cache. In some examples, the data writing component 430 may be configured as or otherwise support a means for suppressing transferring the data associated with each physical address of the first subset from the cache of the first section to the respective physical address of a respective memory device of the plurality of memory devices.

In some examples, the parameter adjustment component 445 may be configured as or otherwise support a means for modifying the parameter associated with the indication of the physical address to indicate that data associated with the physical address is written to a memory device coupled with a second circuit, where access operations associated with the data bypass the cache.

In some examples, the command communication component 425 may be configured as or otherwise support a means for receiving, from the first circuit, signaling indicating a command to access the data associated with the physical address. In some examples, the data retrieval component 460 may be configured as or otherwise support a means for retrieving the data according to the second protocol directly from the second circuit coupled with the memory device based at least in part on the parameter, where bypassing the cache includes retrieving the data. In some examples, the data transmission component 455 may be configured as or otherwise support a means for transmitting the data to the first circuit based at least in part on retrieving the data from the second circuit.

In some examples, the data transmission component 455 may be configured as or otherwise support a means for transferring data representative of a physical address from a first cache of the first section to a second cache associated with a second section of the plurality based at least in part on the temperature of the first section and a temperature of the second section.

In some examples, the command communication component 425 may be configured as or otherwise support a means for communicating, using a first circuit on a substrate, first signaling indicative of first commands and first data according to a first protocol. In some examples, the data writing component 430 may be configured as or otherwise support a means for writing, using a plurality of caches, at least a subset of the first data according to physical addresses associated with respective commands of the first commands. In some examples, the command communication component 425 may be configured as or otherwise support a means for communicating, using a plurality of second circuits on the substrate and with a plurality of memory devices, second signaling indicative of second commands and second data according to a second protocol, where communicating the second signaling includes reading at least a portion of the subset of the first data to obtain the second data and writing the second data to one or more of the plurality of memory devices, and where each of a plurality of sections of the substrate includes at least one of the plurality of second circuits. In some examples, the temperature sensing component 435 may be configured as or otherwise support a means for sensing respective temperatures at respective locations of the substrate using a plurality of sensors located at the respective locations of the substrate. In some examples, the temperature processing component 440 may be configured as or otherwise support a means for determining, at a logic on the substrate, whether a temperature of a first section of the plurality of sections of the substrate satisfies a threshold based at least in part on the respective temperatures sensed at the respective locations. In some examples, the parameter adjustment component 445 may be configured as or otherwise support a means for modifying, at a second circuit configured to generate a plurality of clock signals, each clock signal of the plurality of clock signals associated with a section of the plurality of sections of the substrate, a frequency of a first clock signal associated with the first section relative to a frequency of a second clock signal associated with a second section based at least in part on determining that the temperature of the first section satisfies the threshold. The circuit operation component 450 may be configured as or otherwise support a means for operating the plurality of second circuits based at least in part on the frequency of the first clock signal and the frequency of the second clock signal.

In some examples, the circuit operation component 450 may be configured as or otherwise support a means for operating a first cache of the plurality associated with the first section according to the frequency of the first clock signal. In some examples, the circuit operation component 450 may be configured as or otherwise support a means for operating a second cache of the plurality associated with the second section according to the frequency of the second clock signal, where operating the plurality of second circuits is based at least in part on operating the first cache and the second cache.

In some examples, the circuit operation component 450 may be configured as or otherwise support a means for operating a first portion of a third circuit according to the modified frequency of the first clock signal. In some examples, the circuit operation component 450 may be configured as or otherwise support a means for operating second portion of the third circuit according to the frequency of the second clock signal, where operating the plurality of second circuits is based at least in part on operating the first section and the second section.

In some examples, the modified frequency of the first clock signal is less than the frequency of the second clock signal.

Figure 5:
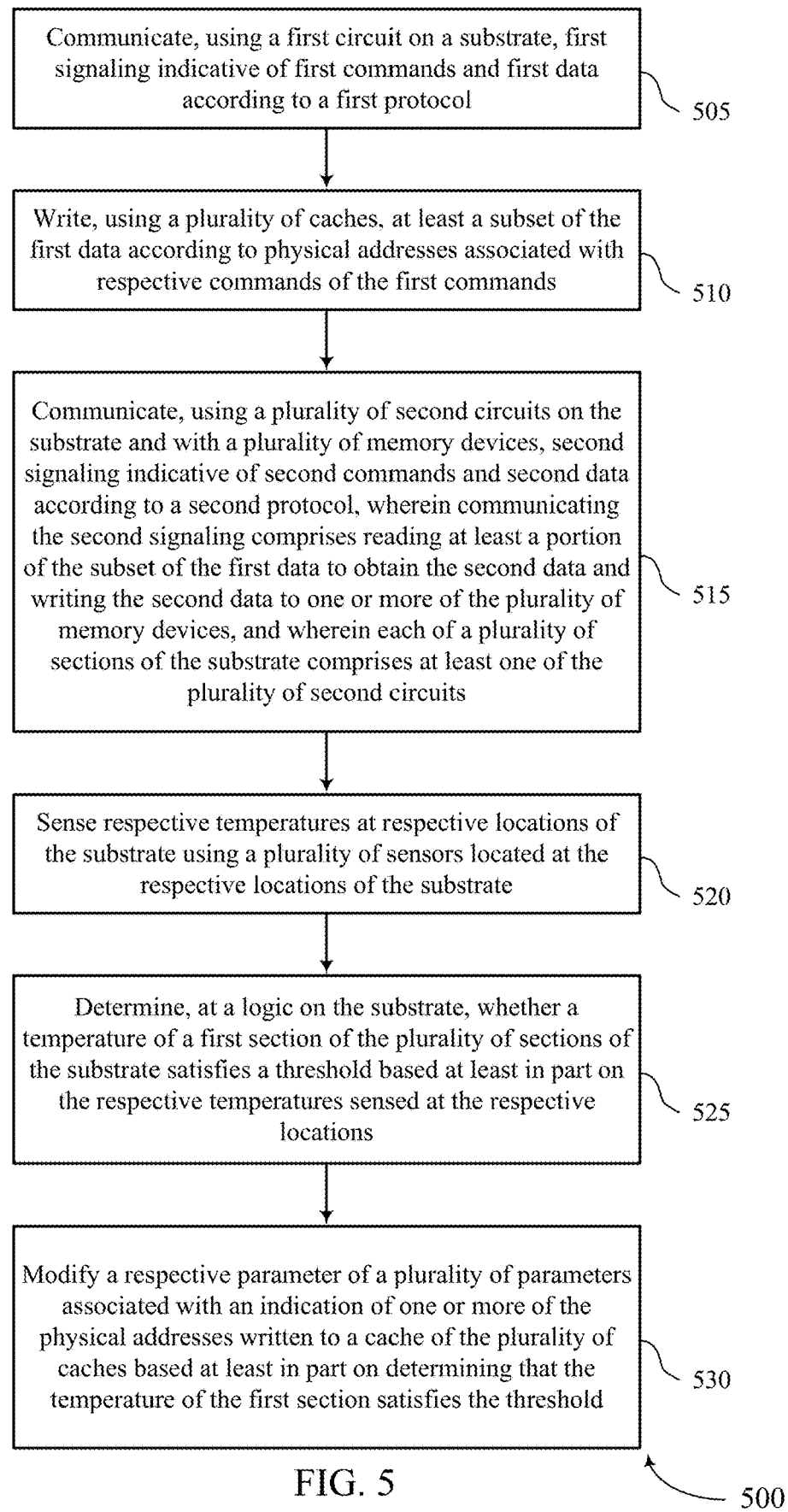
FIGS. 5 and 6 show flowcharts illustrating a method or methods that support adaptive temperature protection for a memory controller in accordance with examples as disclosed herein.

FIG. 5 shows a flowchart illustrating a method 500 that supports adaptive temperature protection for a memory controller in accordance with examples as disclosed herein. The operations of method 500 may be implemented by a memory expander or its components as described herein. For example, the operations of method 500 may be performed by a memory expander as described with reference to FIGS. 1 through 4. In some examples, a memory expander may execute a set of instructions to control the functional elements of the device to perform the described functions. Additionally, or alternatively, the memory expander may perform aspects of the described functions using special-purpose hardware.

At 505, the method may include communicating, using a first circuit on a substrate, first signaling indicative of first commands and first data according to a first protocol. The operations of 505 may be performed in accordance with examples as disclosed herein. In some examples, aspects of the operations of 505 may be performed by a command communication component 425 as described with reference to FIG. 4.

At 510, the method may include writing, using a plurality of caches, at least a subset of the first data according to physical addresses associated with respective commands of the first commands. The operations of 510 may be performed in accordance with examples as disclosed herein. In some examples, aspects of the operations of 510 may be performed by a data writing component 430 as described with reference to FIG. 4.

At 515, the method may include communicating, using a plurality of second circuits on the substrate and with a plurality of memory devices, second signaling indicative of second commands and second data according to a second protocol, where communicating the second signaling includes reading at least a portion of the subset of the first data to obtain the second data and writing the second data to one or more of the plurality of memory devices, and where each of a plurality of sections of the substrate includes at least one of the plurality of second circuits. The operations of 515 may be performed in accordance with examples as disclosed herein. In some examples, aspects of the operations of 515 may be performed by a command communication component 425 as described with reference to FIG. 4.

At 520, the method may include sensing respective temperatures at respective locations of the substrate using a plurality of sensors located at the respective locations of the substrate. The operations of 520 may be performed in accordance with examples as disclosed herein. In some examples, aspects of the operations of 520 may be performed by a temperature sensing component 435 as described with reference to FIG. 4.

At 525, the method may include determining, at a logic on the substrate, whether a temperature of a first section of the plurality of sections of the substrate satisfies a threshold based at least in part on the respective temperatures sensed at the respective locations. The operations of 525 may be performed in accordance with examples as disclosed herein. In some examples, aspects of the operations of 525 may be performed by a temperature processing component 440 as described with reference to FIG. 4.

At 530, the method may include modifying a respective parameter of a plurality of parameters associated with an indication of one or more of the physical addresses written to a cache of the plurality of caches based at least in part on determining that the temperature of the first section satisfies the threshold. The operations of 530 may be performed in accordance with examples as disclosed herein. In some examples, aspects of the operations of 530 may be performed by a parameter adjustment component 445 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for communicating, using a first circuit on a substrate, first signaling indicative of first commands and first data according to a first protocol; writing, using a plurality of caches, at least a subset of the first data according to physical addresses associated with respective commands of the first commands; communicating, using a plurality of second circuits on the substrate and with a plurality of memory devices, second signaling indicative of second commands and second data according to a second protocol, where communicating the second signaling includes reading at least a portion of the subset of the first data to obtain the second data and writing the second data to one or more of the plurality of memory devices, and where each of a plurality of sections of the substrate includes at least one of the plurality of second circuits; sensing respective temperatures at respective locations of the substrate using a plurality of sensors located at the respective locations of the substrate; determining, at a logic on the substrate, whether a temperature of a first section of the plurality of sections of the substrate satisfies a threshold based at least in part on the respective temperatures sensed at the respective locations; and modifying a respective parameter of a plurality of parameters associated with an indication of one or more of the physical addresses written to a cache of the plurality of caches based at least in part on determining that the temperature of the first section satisfies the threshold.

Aspect 2: The method, apparatus, or non-transitory computer-readable medium of aspect 1, further including operations, features, circuitry, logic, means, or instructions, or any combination thereof for modifying the respective parameter associated with a first subset of the one or more physical addresses to indicate to transfer respective data associated with each physical address of the first subset and transferring the data associated with each physical address of the first subset from the cache of the first section to the respective physical address of a respective memory device of the plurality of memory devices.

Aspect 3: The method, apparatus, or non-transitory computer-readable medium of aspect 2, further including operations, features, circuitry, logic, means, or instructions, or any combination thereof for modifying a second parameter associated with a second subset of the one or more physical addresses to indicate that data associated with the physical address is written to the cache and suppressing transferring the data associated with each physical address of the first subset from the cache of the first section to the respective physical address of a respective memory device of the plurality of memory devices.

Aspect 4: The method, apparatus, or non-transitory computer-readable medium of any of aspects 1 through 3, further including operations, features, circuitry, logic, means, or instructions, or any combination thereof for modifying the parameter associated with the indication of the physical address to indicate that data associated with the physical address is written to a memory device coupled with a second circuit, where access operations associated with the data bypass the cache.

Aspect 5: The method, apparatus, or non-transitory computer-readable medium of aspect 4, further including operations, features, circuitry, logic, means, or instructions, or any combination thereof for receiving, from the first circuit, signaling indicating a command to access the data associated with the physical address; retrieving the data according to the second protocol directly from the second circuit coupled with the memory device based at least in part on the parameter, where bypassing the cache includes retrieving the data; and transmitting the data to the first circuit based at least in part on retrieving the data from the second circuit.

Aspect 6: The method, apparatus, or non-transitory computer-readable medium of any of aspects 1 through 5, further including operations, features, circuitry, logic, means, or instructions, or any combination thereof for transferring data representative of a physical address from a first cache of the first section to a second cache associated with a second section of the plurality based at least in part on the temperature of the first section and a temperature of the second section.

Figure 6:
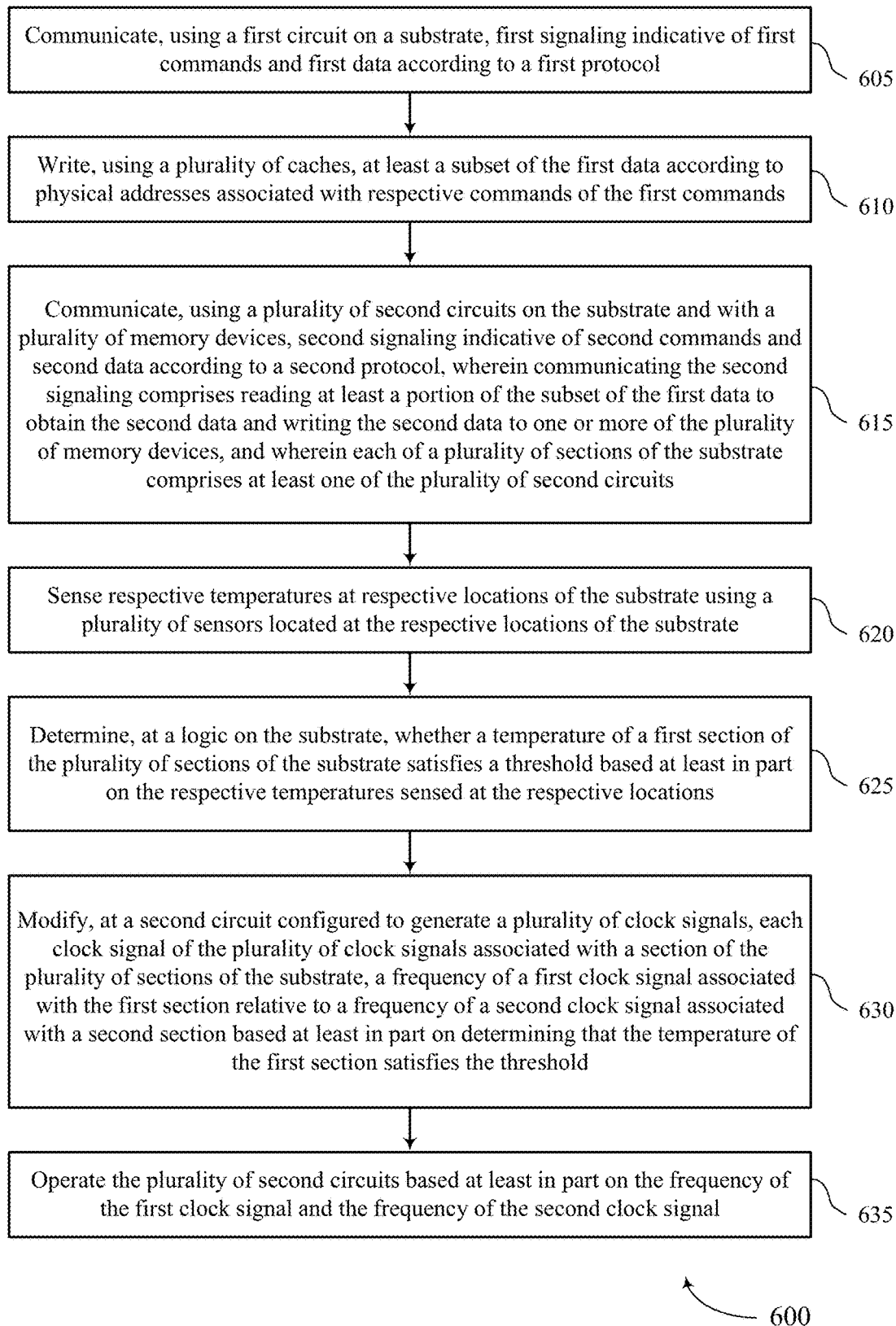

FIG. 6 shows a flowchart illustrating a method 600 that supports adaptive temperature protection for a memory controller in accordance with examples as disclosed herein. The operations of method 600 may be implemented by a memory expander or its components as described herein. For example, the operations of method 600 may be performed by a memory expander as described with reference to FIGS. 1 through 4. In some examples, a memory expander may execute a set of instructions to control the functional elements of the device to perform the described functions. Additionally, or alternatively, the memory expander may perform aspects of the described functions using special-purpose hardware.

At 605, the method may include communicating, using a first circuit on a substrate, first signaling indicative of first commands and first data according to a first protocol. The operations of 605 may be performed in accordance with examples as disclosed herein. In some examples, aspects of the operations of 605 may be performed by a command communication component 425 as described with reference to FIG. 4.

At 610, the method may include writing, using a plurality of caches, at least a subset of the first data according to physical addresses associated with respective commands of the first commands. The operations of 610 may be performed in accordance with examples as disclosed herein. In some examples, aspects of the operations of 610 may be performed by a data writing component 430 as described with reference to FIG. 4.

At 615, the method may include communicating, using a plurality of second circuits on the substrate and with a plurality of memory devices, second signaling indicative of second commands and second data according to a second protocol, where communicating the second signaling includes reading at least a portion of the subset of the first data to obtain the second data and writing the second data to one or more of the plurality of memory devices, and where each of a plurality of sections of the substrate includes at least one of the plurality of second circuits. The operations of 615 may be performed in accordance with examples as disclosed herein. In some examples, aspects of the operations of 615 may be performed by a command communication component 425 as described with reference to FIG. 4.

At 620, the method may include sensing respective temperatures at respective locations of the substrate using a plurality of sensors located at the respective locations of the substrate. The operations of 620 may be performed in accordance with examples as disclosed herein. In some examples, aspects of the operations of 620 may be performed by a temperature sensing component 435 as described with reference to FIG. 4.

At 625, the method may include determining, at a logic on the substrate, whether a temperature of a first section of the plurality of sections of the substrate satisfies a threshold based at least in part on the respective temperatures sensed at the respective locations. The operations of 625 may be performed in accordance with examples as disclosed herein. In some examples, aspects of the operations of 625 may be performed by a temperature processing component 440 as described with reference to FIG. 4.

At 630, the method may include modifying, at a second circuit configured to generate a plurality of clock signals, each clock signal of the plurality of clock signals associated with a section of the plurality of sections of the substrate, a frequency of a first clock signal associated with the first section relative to a frequency of a second clock signal associated with a second section based at least in part on determining that the temperature of the first section satisfies the threshold. The operations of 630 may be performed in accordance with examples as disclosed herein. In some examples, aspects of the operations of 630 may be performed by a parameter adjustment component 445 as described with reference to FIG. 4.

At 635, the method may include operating the plurality of second circuits based at least in part on the frequency of the first clock signal and the frequency of the second clock signal. The operations of 635 may be performed in accordance with examples as disclosed herein. In some examples, aspects of the operations of 635 may be performed by a circuit operation component 450 as described with reference to FIG. 4.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 7: A method, apparatus, or non-transitory computer-readable medium including operations, features, circuitry, logic, means, or instructions, or any combination thereof for communicating, using a first circuit on a substrate, first signaling indicative of first commands and first data according to a first protocol; writing, using a plurality of caches, at least a subset of the first data according to physical addresses associated with respective commands of the first commands; communicating, using a plurality of second circuits on the substrate and with a plurality of memory devices, second signaling indicative of second commands and second data according to a second protocol, where communicating the second signaling includes reading at least a portion of the subset of the first data to obtain the second data and writing the second data to one or more of the plurality of memory devices, and where each of a plurality of sections of the substrate includes at least one of the plurality of second circuits; sensing respective temperatures at respective locations of the substrate using a plurality of sensors located at the respective locations of the substrate; determining, at a logic on the substrate, whether a temperature of a first section of the plurality of sections of the substrate satisfies a threshold based at least in part on the respective temperatures sensed at the respective locations; modifying, at a second circuit configured to generate a plurality of clock signals, each clock signal of the plurality of clock signals associated with a section of the plurality of sections of the substrate, a frequency of a first clock signal associated with the first section relative to a frequency of a second clock signal associated with a second section based at least in part on determining that the temperature of the first section satisfies the threshold; and operating the plurality of second circuits based at least in part on the frequency of the first clock signal and the frequency of the second clock signal.

Aspect 8: The method, apparatus, or non-transitory computer-readable medium of aspect 7, further including operations, features, circuitry, logic, means, or instructions, or any combination thereof for operating a first cache of the plurality associated with the first section according to the frequency of the first clock signal and operating a second cache of the plurality associated with the second section according to the frequency of the second clock signal, where operating the plurality of second circuits is based at least in part on operating the first cache and the second cache.

Aspect 9: The method, apparatus, or non-transitory computer-readable medium of any of aspects 7 through 8, further including operations, features, circuitry, logic, means, or instructions, or any combination thereof for operating a first portion of a third circuit according to the modified frequency of the first clock signal and operating second portion of the third circuit according to the frequency of the second clock signal, where operating the plurality of second circuits is based at least in part on operating the first section and the second section.

Aspect 10: The method, apparatus, or non-transitory computer-readable medium of any of aspects 7 through 9 where the modified frequency of the first clock signal is less than the frequency of the second clock signal.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 11: A system, including: a substrate including: a first circuit configured to communicate signaling indicative of first commands and first data according to a first protocol; a plurality of second circuits each configured to be coupled with one or more memory devices, and to communicate signaling indicative of second commands and second data according to a second protocol, where each of a plurality of sections of the substrate includes at least one of the plurality of second circuits; a plurality of sensors each configured to sense a respective temperature at a respective location of the substrate; a second circuit configured to generate a plurality of clock signals each associated with a respective section of the plurality of sections of the substrate; and a logic configured to: determine whether a temperature of a first section of the plurality of sections of the substrate exceeds a threshold based at least in part on the respective temperatures sensed by the plurality of sensors; modify a frequency of a first clock signal of the plurality of clock signals associated with the first section relative to a frequency of a second clock signal of the plurality of clock signals associated with a second section based at least in part on the temperature of the first section exceeding the threshold; and operate the system based at least in part on the modified frequency of the first clock signal and the frequency of the second clock signal.

Aspect 12: The system of aspect 11, where the substrate further includes a plurality of caches, and where the logic is configured to: operate a first cache of the plurality associated with the first section according to the modified frequency of the first clock signal; and operate a second cache associated with the second section according to the frequency of the second clock signal, where operating the system is based at least in part on operating the first cache and the second cache.

Aspect 13: The system of aspect 12, where each section of the plurality of sections includes a respective subset of the plurality of caches or a respective subset of the plurality of second circuits, or any combination thereof.

Aspect 14: The system of any of aspects 12 through 13, where substrate further includes a third circuit, and where the logic is further configured to: operate a first portion of the third circuit according to the modified frequency of the first clock signal; and operate a second portion of the third circuit according to the frequency of the second clock signal.

Aspect 15: The system of any of aspects 11 through 14, where the modified frequency of the first clock signal is less than the frequency of the second clock signal.

Aspect 16: The system of any of aspects 11 through 15, where the logic is further configured to: modify a respective parameter of a plurality of parameters associated with an indication of a first subset of one or more physical addresses written to a cache of a plurality of caches to indicate to transfer respective data associated with each physical address of the first subset; and transfer the data associated with each physical address of the first subset from the cache of the first section to the respective physical address of a respective memory device of the one or more memory devices.

Aspect 17: The system of aspect 16, where the logic is further configured to: modify a second parameter associated with a second subset of the one or more physical addresses to indicate that data associated with the respective physical address of the second subset is written to the cache; and suppress transferring the data associated with each physical address of the first subset from the cache of the first section to the respective physical address of a respective memory device of the one or more memory devices.

Aspect 18: The system of any of aspects 16 through 17, where the logic is further configured to: modify a parameter associated with the indication of a physical address to indicate that data associated with the physical address is written to a memory device coupled with one of the plurality of second circuits, where access operations associated with the data bypass the cache.

Aspect 19: The system of aspect 18, where the logic is further configured to: receive, from the first circuit, signaling indicating a command to access the data associated with the physical address; retrieve the data directly from the second circuit coupled with the memory device based at least in part on the parameter, where bypassing the cache includes retrieving the data; and transmit the data to the first circuit based at least in part on retrieving the data from the second circuit.

Aspect 20: The system of any of aspects 16 through 19, where the logic is further configured to: transfer data representative of a physical address from a first cache associated with the first section to a second cache associated with the second section of the plurality based at least in part on the temperature of the first section and a temperature of the second section.

An apparatus is described. The following provides an overview of aspects of the apparatus as described herein:

Aspect 21: A system, including: a substrate including: a first circuit configured to communicate signaling indicative of first commands and first data according to a first protocol; a plurality of second circuits each configured to be coupled with one or more memory devices, and to communicate signaling indicative of second commands and second data according to a second protocol, where each of a plurality of sections of the substrate includes at least one of the plurality of second circuits; a plurality of caches; a first logic configured to access the plurality of caches; a plurality of sensors each configured to sense a respective temperature at a respective location of the substrate; and a second logic configured to: determine whether a temperature of a first section of the plurality of sections of the substrate exceeds a threshold based at least in part on the respective temperatures sensed by the plurality of sensors; and modify a respective parameter of a plurality of parameters associated with an indication of one or more physical addresses written to a cache of the plurality of caches based at least in part on the temperature of the first section exceeding the threshold.

Aspect 22: The system of aspect 21, where the second logic is further configured to: modify the respective parameter associated with a first subset of the one or more physical addresses to indicate to transfer respective data associated with each physical address of the first subset; and transfer the data associated with each physical address of the first subset from the cache of the first section to the respective physical address of a respective memory device of the one or more memory devices.

Aspect 23: The system of aspect 22, where the second logic is further configured to: modify a second parameter associated with a second subset of the one or more physical addresses to indicate that data associated with the physical address is written to the cache; and suppress transferring the data associated with each physical address of the first subset from the cache of the first section to the respective physical address of a respective memory device of the one or more memory devices.

Aspect 24: The system of any of aspects 21 through 23, where the second logic is further configured to: modify the parameter associated with the indication of the physical address to indicate that data associated with the physical address is written to a memory device coupled with a second circuit of the plurality of second circuits, where access operations associated with the data bypass the cache.

Aspect 25: The system of aspect 24, where the second logic is further configured to: receive, from the first circuit, signaling indicating a command to access the data associated with the physical address; retrieve the data directly from the second circuit coupled with the memory device based at least in part on the parameter, where bypassing the cache includes retrieving the data; and transmit the data to the first circuit based at least in part on retrieving the data from the second circuit.

Aspect 26: The system of any of aspects 21 through 25, where the second logic is further configured to: transfer data representative of a physical address from a first cache of the first section to a second cache associated with a second section of the plurality based at least in part on the temperature of the first section and a temperature of the second section.

Aspect 27: The system of any of aspects 21 through 26, the substrate further including a third circuit configured to generate a plurality of clock signals, each clock signal of the plurality of clock signals associated with a respective section of the plurality of sections of the substrate where the second logic is further configured to: modify a frequency of a first clock signal associated with the first section relative to a frequency of a second clock signal associated with a second section based at least in part on determining that the temperature of the first section exceeds the threshold; and operate the system based at least in part on the frequency of the first clock signal and the frequency of the second clock signal.

Aspect 28: The system of aspect 27, where the second logic is further configured to: operate a first cache of the plurality associated with the first section according to the modified frequency of the first clock signal; and operate a second cache associated with the second section according to the frequency of the second clock signal, where operating the system is based at least in part on operating the first cache and the second cache.

Aspect 29: The system of any of aspects 27 through 28, where the second logic is further configured to: operate a first portion of the third circuit according to the modified frequency of the first clock signal; and operate a second portion of the third circuit according to the frequency of the second clock signal.

Aspect 30: The system of any of aspects 27 through 29, where the modified frequency of the first clock signal is less than the frequency of the second clock signal.

Aspect 31: The system of any of aspects 27 through 30, where each section of the plurality of sections includes a respective subset of the plurality of caches or a respective subset of the plurality of second circuits, or any combination thereof.

An apparatus is described. The following provides an overview of aspects of the apparatus as described herein:

Aspect 32: A system, including: a substrate including: a first circuit configured to communicate signaling indicative of first commands and first data according to a first protocol; a plurality of second circuits each configured to be coupled with one or more memory devices, and to communicate signaling indicative of second commands and second data according to a second protocol, where each of a plurality of sections of the substrate includes at least one of the plurality of second circuits; a plurality of caches; a first logic configured to access the plurality of caches; a plurality of sensors each configured to sense a respective temperature at a respective location of the substrate; a second circuit configured to generate a plurality of clock signals each associated with a respective section of the plurality of sections of the substrate; and a second logic configured to: determine whether a rate of change of a temperature of a first section of the plurality of sections of the substrate exceeds a first threshold and whether the temperature of the first section exceeds a second threshold; modify a parameter of a plurality of parameters associated with an indication of one or more physical addresses written to a cache of the plurality of caches based at least in part on the rate of change of the temperature of the first section and the temperature of the first section; and operate the system based at least in part on the modified parameter.

Aspect 33: The system of aspect 32, where the second logic is further configured to: modify a frequency of a first clock signal associated with the first section relative to a frequency of a second clock signal associated with a second section based at least in part on determining that a predicted temperature of the first section exceeds a threshold, where the parameter includes the frequency of the first clock signal; and operate the system based at least in part on the frequency of the first clock signal and the frequency of the second clock signal.

Aspect 34: The system of any of aspects 32 through 33, where the second logic is further configured to: modify respective parameters associated with a first subset of the one or more physical addresses to indicate to transfer respective data associated with each physical address of the first subset; and transfer the data associated with each physical address of the first subset from the cache of the first section to the respective physical address of a respective memory device of the one or more memory devices.

Aspect 35: The system of aspect 34, where the second logic is further configured to: modify a second parameter associated with a second subset of the one or more physical addresses to indicate that data associated with the physical address is written to the cache; and suppress transferring the data associated with each physical address of the first subset from the cache of the first section to the respective physical address of a respective memory device of the one or more memory devices.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A substrate, comprising:
   a first circuit configured to communicate signaling indicative of first commands and first data according to a first protocol;
   a plurality of second circuits each coupled with a respective one or more memory devices and configured to communicate signaling indicative of second commands and second data according to a second protocol;
   a plurality of sections each comprising at least one of the plurality of second circuits;
   a plurality of sensors each configured to sense a respective temperature at a respective section of the plurality of sections; and
   logic configured to:
      determine whether a temperature of a first section of the plurality of sections exceeds a threshold based on the respective temperatures sensed by the plurality of sensors; and
      transfer information from first memory associated with the first section to second memory based on the temperature of the first section exceeding the threshold.

2. The substrate of claim 1, further comprising:
   a plurality of caches each coupled with at least one second circuit of the plurality of second circuits, wherein each section of the plurality of sections comprises at least one cache of the plurality of caches.

3. The substrate of claim 2, wherein, to transfer the information, the logic is configured to:
   read one or more device physical addresses from a first cache of the first section; and
   write the one or more device physical addresses to a second cache of a second section of the plurality of sections.

4. The substrate of claim 2, wherein, to transfer the information, the logic is configured to:
   read, from a first memory device coupled with a second circuit of the plurality of second circuits of the first section, data associated with one or more physical addresses written to a first cache of the first section; and
   write, to a second memory device coupled with a second circuit of the plurality of second circuits of a second section of the plurality of sections, the data.

5. The substrate of claim 2, wherein, to transfer the information, the logic is configured to:

transfer data associated with one or more physical addresses written to a first cache of the plurality of caches of the first section from the first cache to a memory device.

6. The substrate of claim 5, wherein the logic is configured to:
receive a command to access the data associated with the one or more physical addresses; and
bypass the first cache to directly retrieve the data from a second circuit of the plurality of second circuits coupled with the memory device.

7. The substrate of claim 1, further comprising:
a third circuit configured to generate a plurality of clock signals each associated with a respective section of the plurality of sections.

8. The substrate of claim 7, wherein the logic is configured to:
modify a frequency of a first clock signal of the plurality of clock signals associated with the first section relative to a frequency of a second clock signal of the plurality of clock signals associated with a second section based on the temperature of the first section exceeding the threshold.

9. The substrate of claim 8, wherein the logic is configured to:
operate a first cache of a plurality of caches of the substrate associated with the first section according to the modified frequency of the first clock signal.

10. A method, comprising:
communicating, using a first circuit on a substrate, first signaling indicative of first commands and first data according to a first protocol;
communicating, using a plurality of second circuits on the substrate and a plurality of memory devices, second signaling indicative of second commands and second data according to a second protocol, wherein the substrate comprises a plurality of sections that each comprise at least one second circuit of the plurality of second circuits;
sensing, using a plurality of sensors on the substrate, a temperature at each section of the plurality of sections of the substrate;
determining, using logic on the substrate, whether a temperature of a first section of the plurality of sections exceeds a threshold based on the temperatures sensed by the plurality of sensors; and
transferring information from first memory associated with the first section to second memory based on the temperature of the first section exceeding the threshold.

11. The method of claim 10, wherein transferring the information comprises:
reading one or more device physical addresses from a first cache of the first section; and
write the one or more device physical addresses to a second cache of a second section of the plurality of sections.

12. The method of claim 10, wherein transferring the information comprises:
reading, from a first memory device coupled with a second circuit of the plurality of second circuits of the first section, data associated with one or more physical addresses written to a first cache of the first section; and
writing, to a second memory device coupled with a second circuit of the plurality of second circuits of a second section of the plurality of sections, the data.

13. The method of claim 10, wherein transferring the information comprises:
transferring data associated with one or more physical addresses written to a first cache of a plurality of caches of the first section from the first cache to a memory device.

14. The method of claim 13, further comprising:
receiving a command to access the data associated with the one or more physical addresses; and
bypassing the first cache to directly retrieve the data from a second circuit of the plurality of second circuits coupled with the memory device.

15. The method of claim 10, further comprising:
modifying, using a third circuit on the substrate, a frequency of a first clock signal of a plurality of clock signals associated with the first section relative to a frequency of a second clock signal of the plurality of clock signals associated with a second section based on the temperature of the first section exceeding the threshold.

16. A non-transitory computer-readable medium storing code comprising instructions which, when executed by processing circuitry of a system, cause the system to:
communicate, using a first circuit on a substrate, first signaling indicative of first commands and first data according to a first protocol;
communicate, using a plurality of second circuits on the substrate and a plurality of memory devices, second signaling indicative of second commands and second data according to a second protocol, wherein the substrate comprises a plurality of sections that each comprise at least one second circuit of the plurality of second circuits;
sense, using a plurality of sensors on the substrate, a temperature at each section of the plurality of sections of the substrate;
determine, using logic on the substrate, whether a temperature of a first section of the plurality of sections exceeds a threshold based on the temperatures sensed by the plurality of sensors; and
transfer information from first memory associated with the first section to second memory based on the temperature of the first section exceeding the threshold.

17. The non-transitory computer-readable medium of claim 16, wherein, to transfer the information, the instructions are executable by the processing circuitry to:
reading one or more device physical addresses from a first cache of the first section; and
write the one or more device physical addresses to a second cache of a second section of the plurality of sections.

18. The non-transitory computer-readable medium of claim 16, wherein, to transfer the information, the instructions are executable by the processing circuitry to:
read, from a first memory device coupled with a second circuit of the plurality of second circuits of the first section, data associated with one or more physical addresses written to a first cache of the first section; and
write, to a second memory device coupled with a second circuit of the plurality of second circuits of a second section of the plurality of sections, the data.

19. The non-transitory computer-readable medium of claim 16, wherein, to transfer the information, the instructions are executable by the processing circuitry to:
transfer data associated with one or more physical addresses written to a first cache of a plurality of caches of the first section from the first cache to a memory device.

20. The non-transitory computer-readable medium of claim 19, wherein the instructions are further executable by the processing circuitry to:
    receive a command to access the data associated with the one or more physical addresses; and
    bypass the first cache to directly retrieve the data from a second circuit of the plurality of second circuits coupled with the memory device.

\* \* \* \* \*